(12) United States Patent
Pucci et al.

(10) Patent No.: US 12,034,414 B2
(45) Date of Patent: Jul. 9, 2024

(54) MULTI-MODAL AUDIO AMPLIFIER AND RELATED SYSTEM

(71) Applicant: Bose Corporation, Framingham, MA (US)

(72) Inventors: Lino Antony Pucci, Wellesley Hills, MA (US); Thomas Edward McBrine, N. Attleboro, MA (US); Douglas J. Cunningham, II, Groton, MA (US)

(73) Assignee: Bose Corporation, Framingham, MA (US)

( * ) Notice: Subject to any disclaimer, the term of this patent is extended or adjusted under 35 U.S.C. 154(b) by 483 days.

(21) Appl. No.: 17/397,090

(22) Filed: Aug. 9, 2021

(65) Prior Publication Data

US 2023/0041832 A1 Feb. 9, 2023

(51) Int. Cl.
| | |
|---|---|
| *H03F 3/217* | (2006.01) |
| *G06F 3/16* | (2006.01) |
| *H03F 3/181* | (2006.01) |
| *H04R 1/28* | (2006.01) |
| *H04R 3/12* | (2006.01) |

(52) U.S. Cl.
CPC ............. *H03F 3/181* (2013.01); *G06F 3/165* (2013.01); *H04R 1/2834* (2013.01); *H04R 3/12* (2013.01); *H03F 2200/03* (2013.01)

(58) Field of Classification Search
CPC ....................................................... H03F 3/217
USPC ............................................... 330/251, 207 A
See application file for complete search history.

(56) References Cited

U.S. PATENT DOCUMENTS

| | | | | |
|---|---|---|---|---|
| 10,917,050 | B2 * | 2/2021 | Hogan | .................. H02M 3/158 |
| 11,178,504 | B2 * | 11/2021 | Beckhardt | ............... H04S 3/008 |
| 11,250,833 | B1 * | 2/2022 | Bajic | ................ G10K 11/17875 |
| 11,356,764 | B2 * | 6/2022 | Lehnert | ................... G06F 3/017 |

* cited by examiner

*Primary Examiner* — Henry Choe
(74) *Attorney, Agent, or Firm* — Hoffman Warnick LLC

(57) ABSTRACT

Various aspects include audio amplifiers for driving at least one speaker. In some cases, the amplifier includes: a controller for amplifying at least one input signal to provide an amplified audio output signal, the controller configured to operate the amplifier in at least two modes, including: a first mode including a dedicated connection to the at least one speaker; and a second mode including a direct physical connection with an additional audio amplifier and the dedicated connection to the at least one speaker, where in the first mode and the second mode the amplifier is configured to provide the amplified audio output signal to drive the at least one speaker, and in the second mode the amplifier is configured to forward the at least one input signal to enable the additional audio amplifier to control audio output at an additional speaker.

20 Claims, 5 Drawing Sheets

MULTI-MODAL AUDIO AMPLIFIER AND RELATED SYSTEM

TECHNICAL FIELD

This disclosure generally relates to audio amplifiers and related systems. More particularly, the disclosure relates to audio amplifiers configured to operate in multiple modes to control audio output across distinct system configurations.

BACKGROUND

Many conventional audio amplifiers are limited in the number of loudspeakers that can be connected for the purposes of outputting audio and/or provide multi-device connections that need to be re-established at different times or during different uses.

SUMMARY

All examples and features mentioned below can be combined in any technically possible way.

Various aspects include audio amplifiers for driving at least one speaker. In certain aspects, the audio amplifiers are configured to operate in at least two modes. In additional aspects, a system includes at least two audio amplifiers for separately driving at least one speaker in a speaker set.

In some particular aspects, an amplifier includes: a controller for amplifying at least one input signal to provide an amplified audio output signal, the controller configured to operate the amplifier in at least two modes, including: a first mode including a dedicated connection to the at least one speaker; and a second mode including a direct physical connection with an additional audio amplifier and the dedicated connection to the at least one speaker, where in the first mode and the second mode the amplifier is configured to provide the amplified audio output signal to drive the at least one speaker, and in the second mode the amplifier is configured to forward the at least one input signal to enable the additional audio amplifier to control audio output at an additional speaker.

In additional particular aspects, a method of driving at least one speaker with an amplifier includes: receiving at least one input signal from an input source, amplifying the at least one input signal, and providing an amplified audio output signal to drive the at least one speaker, where the amplifier is configured to operate in at least two modes, including: a first mode including a dedicated connection to the at least one speaker; and a second mode including a direct physical connection with an additional audio amplifier and the dedicated connection to the at least one speaker, where in the first mode and the second mode the amplifier provides the amplified audio output signal to drive the at least one speaker, and where in the second mode the amplifier forwards the at least one input signal to enable the additional audio amplifier to control audio output at an additional speaker.

In further particular aspects, a system includes: a set of at least two audio amplifiers for separately driving at least one speaker in a speaker set, each amplifier including a controller for amplifying at least one input signal to provide an amplified audio output signal, where the controller in a primary amplifier is configured to: provide the amplified audio output signal to at least one of the speakers in the speaker set; and forward the at least one input signal to a second one of the amplifiers, and where the controller in a secondary amplifier is configured to: receive the forwarded at least one input signal; amplify the at least one input signal; and provide the amplified input signal to at least one additional speaker in the set.

Implementations may include one of the following features, or any combination thereof.

In certain cases, the amplifier is incapable of outputting audio without the at least one speaker. In some of these cases, transducers are external to the amplifier housing.

In some implementations, the at least one speaker consists of two distinct speakers.

In particular aspects, the two distinct speakers include passive speakers, which when connected with the amplifier, are not configured to control equalization of the amplified audio output signal.

In certain cases, the audio output signal sent to each of the two distinct speakers has a single equalization setting.

In some implementations, in the second mode the amplifier acts as a master amplifier and the additional amplifier acts as a worker amplifier.

In particular cases, the amplifier further includes an interface switch coupled with the controller that enables a change between the first mode and the second mode, where the controller maintains the selection of the first mode or the second mode until a command is received via the interface switch.

In certain aspects, the interface switch includes a physical switch located on a housing of the amplifier.

In some implementations, in the first mode the controller assigns a first equalization setting to the amplified audio output signal, and in the second mode the controller assigns a second, distinct equalization setting to the amplified audio output signal.

In particular cases, the amplifier further includes a communications module for receiving the at least one audio input signal from an audio input source. In certain examples, the audio input source is connected with the amplifier by WiFi, Ethernet, Bluetooth (including variants), etc.

In some aspects, the controller is configured to compensate for a delay between the at least one input signal and the amplified audio output signal, where the delay compensation is adjustable. In particular examples, delay compensation can be beneficial when the two distinct speakers are in the same space, such as the same room.

In particular implementations, the amplifier further includes an installation interface for assigning the at least one speaker to the audio amplifier in a grouping. In particular examples, the installation interface is accessible with a software application, or app, that can be controlled with a smart device. In certain cases, the interface enables grouping of speakers, for example, in zones.

In some aspects, the installation interface includes an equalization selection control for assigning equalization settings to the amplified audio output signal based on a type of speaker connected with the amplifier. In certain cases, the type of speaker is defined by at least one of: intended use (e.g., indoor, outdoor, wall mount, ceiling mount, etc.), type of enclosure, acoustic components (e.g., number of drivers and/or driver size), or intended placement in a room (e.g., upright, lying flat, etc.).

In particular implementations, the equalization selection control permits selection between at least five equalization settings.

In some aspects, in the second mode the controller is configured to: switch the amplifier into a low power mode after a period without receiving the audio input signal; and wake the amplifier from the low power mode in response to detecting the audio input signal. In certain cases, a micro, such as a low power micro is run on the amplifier controller or another circuit at the audio amplifier and is configured to detect activity on the audio line.

In particular implementations, in the first mode, the controller is configured to: switch the amplifier into a low power mode in response to losing a connection with an audio input source; and wake the amplifier from the lower power mode in response to detecting the connection with the audio input source. In certain cases, detecting the loss of connection with the audio input source includes detecting a loss of Wi-Fi or Bluetooth connection, or detecting a loss of a paired connection with a television or visual entertainment device (e.g., via a signal detected from the TV or visual entertainment device).

Two or more features described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

Figure 1:
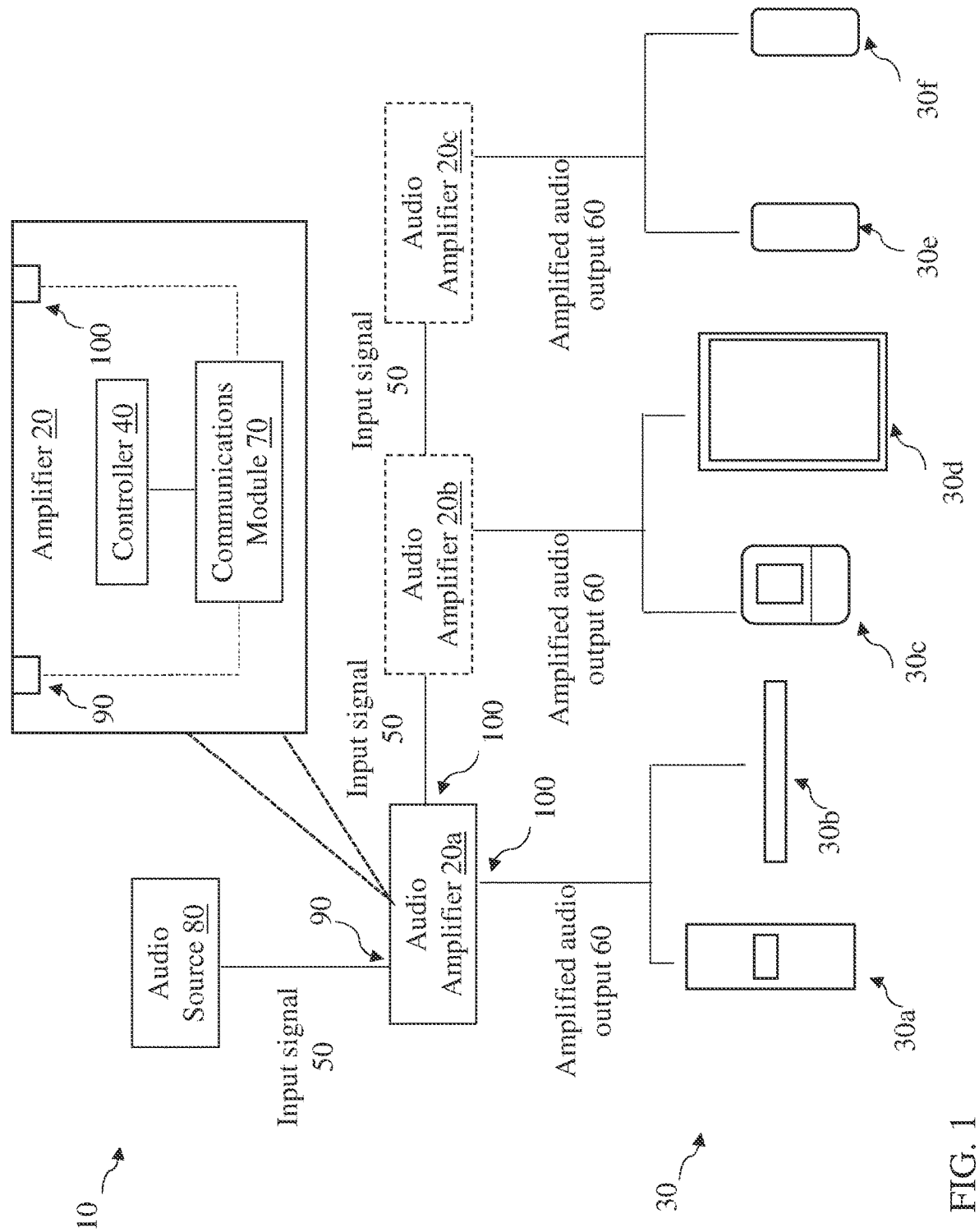
FIG. 1 is a schematic depiction of an environment illustrating a system according to various implementations.

It is noted that the drawings of the various implementations are not necessarily to scale. The drawings are intended to depict only typical aspects of the disclosure, and therefore should not be considered as limiting the scope of the invention. In the drawings, like numbering represents like elements between the drawings.

DETAILED DESCRIPTION

As noted herein, various aspects of the disclosure generally relate to multi-modal audio amplifiers, related systems, and related control methods. These multi-modal audio amplifiers can enhance the user experience and/or the installer experience in configuring and/or reconfiguring an audio system.

In particular cases, implementations include audio amplifiers that are configured to amplify at least one input signal to provide an amplified audio output signal and operate in at least two modes: a first mode with a dedicated connection to at least one speaker; and a second mode with a direct physical connection with an additional audio amplifier in addition to the dedicated connection to the speaker(s). In both modes, the amplifier provides an amplified audio output signal to drive the speaker(s), and in the second mode the amplifier is configured to forward the input signal(s) to enable the additional audio amplifier to control audio output at an additional speaker.

Commonly labeled components in the FIGURES are considered to be substantially equivalent components for the purposes of illustration, and redundant discussion of those components is omitted for clarity. Numerical ranges and values described according to various implementations are merely examples of such ranges and values, and are not intended to be limiting of those implementations. In some cases, the term "approximately" is used to modify values, and in these cases, can refer to that value +/−a margin of error, such as a measurement error.

FIG. 1 shows an illustrative physical environment, with a system 10 including an audio amplifier 20 for driving at least one speaker 30. In the example illustrated in FIG. 1, a plurality of amplifiers 20a, 20b, 20c are shown, along with a plurality of speakers 30a, 30b, 30c, 30d, etc. However, as indicated by dashed lines, additional amplifiers 20b, 20c and associated speakers 30c, 30d, etc. can be optional in various implementations. An internal schematic view of one of the audio amplifiers (or, amplifier) 20 is illustrated in FIG. 1, and can be considered representative of other amplifiers shown and described herein. In various implementations, the audio amplifier 20 includes a controller 40 for amplifying at least one input signal 50 to provide an amplified audio output signal 60, e.g., to one or more speakers 30a, 30b, 30c, etc. and/or to a connected amplifier 20b, 20c, etc. In various implementations, the audio amplifier 20 has a communications module 70 that receives the input signal(s) 50 from an audio source 80, such as a network audio source or a cloud-based audio source (e.g., an audio input module, an internet-connected or cloud-connected device, etc.). In certain cases, the audio amplifier 20 (e.g., communications module 70) has a hard-wired connection with the audio source 80, such as an Ethernet connection or an RCA analog audio connection. In these cases, an audio input connector 90 can be used to connect the communications module 70 with the audio source 80. In additional implementations, the communications module 70 includes one or more modules for establishing a wireless connection with the audio source 80, such as a Wi-Fi and/or Bluetooth module for communicating with the audio source 80.

As described herein, the controller 40 in amplifier 20 can be programmed to control one or more audio amplification and forwarding functions, including assignment of operating modes and connection with speaker(s) 30 and/or additional amplifier(s) 20. The controller 40 can include conventional hardware and/or software components for executing program instructions or code according to processes described herein. For example, controller 40 can include one or more processors, memory, communications pathways between components, and/or one or more logic engines for executing program code. In certain examples, the controller 40 includes a microcontroller or processor having a digital signal processor (DSP), such that acoustic signals are converted to digital format by analog to digital converters. Controller 40 can be coupled with other components in the amplifier 20 (e.g., communications module 70 and/or processors) via any conventional wireless and/or hardwired connection which allows controller 40 to send/receive signals to/from those components and control operation thereof.

As noted, the amplifiers 20 and speakers 30 shown and described herein can include a communications module (e.g., communications module 70) for communicating with one or more other devices in the environment and/or in a network (e.g., a wireless network). In some cases, the communications module can include a wireless transceiver for communicating with other devices in the environment. In other cases, the communications module can communicate with other devices using any conventional hard-wired connection and/or additional communications protocols. In some cases, communications protocol(s) can include local area wireless network communication protocol (e.g., a wireless fidelity (Wi-Fi) protocol using a wireless local area network (WLAN)), a communication protocol such as IEEE 802.11b/g or 802.11ac, a cellular network-based protocol (e.g., third, fourth or fifth generation (3G, 4G, 5G cellular networks) or one of a plurality of internet-of-things (IoT) protocols, such as: Bluetooth, BLE Bluetooth, ZigBee (mesh LAN), Airplay (and variations), Chromecast (and variations), Z-wave (sub-GHz mesh network), 6LoWPAN (a lightweight IP protocol), LTE protocols, RFID, ultrasonic audio protocols, etc. In additional cases, the communications module can enable the amplifier 20 and/or speaker 30 to communicate with a remote server, such as a cloud-based server running an application for managing amplifier audio groupings. In various particular implementations, separately housed components in amplifier(s) 20 and/or speaker(s) 30 are configured to communicate using one or more conventional wireless transceivers. In certain implementations, as noted herein, the communications module is configured to communicate with other devices and/or a network over both a local area wireless network communication protocol (e.g., Wi-Fi communication protocol) and at least one additional communication protocol (e.g., a direct device communication protocol). The additional communication protocol can include, e.g., Bluetooth or Airplay.

In various implementations, the audio amplifier 20 has an audio output connector 100 for providing the amplified audio output signal 60 to drive audio output at one or more of the speaker 30a, 30b, 30c, and/or to forward the input signal to enable an additional amplifier 20 to control audio output at another speaker 30a, 30b, 30c. Audio output connectors 100 can also be used to connect amplifier 20a with downstream amplifiers (e.g., amplifier 20b). In some cases, the audio output connector 100 enables a direct physical connection between audio amplifiers (e.g., between amplifiers 20a, 20b, 20c). In certain cases, the amplifier(s) 20 can be physically connected to one or more speakers 30a, 30b, etc., however, in additional implementations, the amplifiers 20 can communicate wirelessly with the speaker(s) 30a, 30b, etc., e.g., via the communications module 70.

In various implementations, speakers 30 are passive speakers, which when connected with the amplifier 20, are not configured to control equalization of the amplified audio signal 60. In particular implementations, the audio output signal 60 sent to each of the speakers 30 has a single equalization setting. In certain of these cases, speakers 30 do not include an equalizer or equalizer module.

In some cases, speakers 30 are fixed speakers that are configured to be placed semi-permanently in a position or location, e.g., mounted to a wall, ceiling, audio output unit, etc. In certain cases, speakers 30 include standing speakers, such as those not easily moved within a space, which may be placed on a floor or other surface.

In other cases, speakers 30 include "portable" loudspeakers, which is to say, these loudspeakers have a power storage device (e.g., a battery) as well as connection for an external power source (e.g., a connection with an external power source such as an alternating current (AC) source). In these cases, the portable loudspeaker includes a hard-wired power connection, and can also function using stored (e.g., battery) power. Additionally, a portable loudspeaker with "smart" capabilities (e.g., a portable smart loudspeaker) can have local network connectivity (e.g., to a wireless fidelity, or Wi-Fi network), as well as direct device connectivity (e.g., via Bluetooth (BT) communication protocol, or Airplay communication protocol). It should be noted that although specific implementations of speakers (loudspeakers) primarily serving the purpose of acoustically outputting audio are presented with some degree of detail, such presentations of specific implementations are intended to facilitate understanding through provision of examples and should not be taken as limiting either the scope of disclosure or the scope of claim coverage.

In the example depiction in FIG. 1, a variety of speaker types are shown strictly for illustrative purposes. For example, a first speaker 30a includes a surround speaker such as the Bose Surround Speaker(s) 700, by Bose Corporation (Framingham, MA, USA). A second speaker 30b includes a soundbar such as the Bose Smart Soundbar 700, by Bose Corporation. Speaker 30c can include a smart home speaker such as the Bose Smart Speaker 500, by Bose Corporation. Speaker 30d can include a professional speaker such as the S1 Pro System, by Bose Corporation. Speakers 30e and 30f can include outdoor speakers, such as the 251 Outdoor Speaker, by Bose Corporation. Additional speaker types are also possible in keeping with the various disclosed implementations.

As noted herein, the amplifiers 20 are incapable of outputting audio without the speakers 30. That is, the amplifiers 20 do not have a transducer or other audio output device, and as such, transducer(s) are external to the housing of the amplifiers 20. In other terms, speakers 30 are required in order to provide an audio output in the system 10.

In particular implementations, each amplifier 20 is configured to connect to up to two distinct speakers 30. For example: amplifier 20a is configured to connect to speakers 30a, 30b; amplifier 20b is configured to connect to speakers 30c, 30d; and amplifier 20c is configured to connect to speakers 30e, 30f. This example is only one of many possible configurations for connecting amplifiers 20 with speakers 30. It is also understood that amplifiers 20a, 20b, 20c can be connected in a chain (e.g., a "daisy chain") to facilitate coordinated audio output across groups of speakers 30 that are connected to distinct amplifiers 30. As described herein, amplifiers 20 can be configured to operate in at least two distinct modes in order to coordinate audio output at speakers 30.

Figure 2:
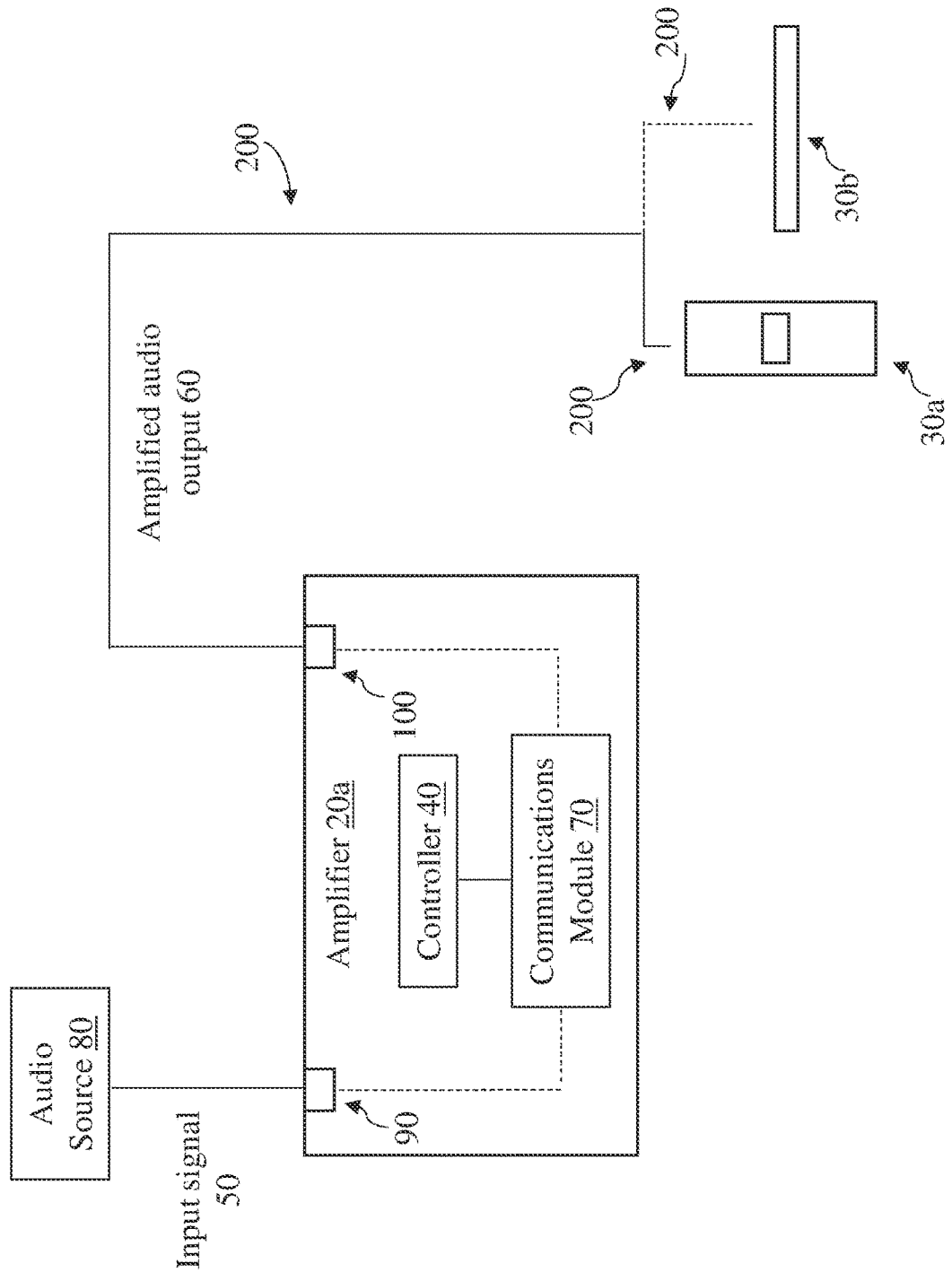
FIG. 2 is a schematic depiction of an audio amplifier coupled with speakers in a first operating mode, according to various implementations.

For example, in a first mode illustrated in FIG. 2, amplifier 20a has a dedicated connection to speaker 30a. In this first mode, amplifier 20a can also have a dedicated connection to speaker 30b (illustrated in phantom). In particular cases, the amplifier 20a is capable of making a dedicated connection with up to two distinct speakers 30. In further embodiments, the amplifier 20a is capable of making a dedicated connection with additional speakers 30, but can have a limited number of dedicated connections, e.g., up to 4 dedicated connections, such as up to two distinct pairs of speakers. In particular cases, as illustrated in FIG. 2, an RCA cable 200 (e.g., an analog audio connector) provides the dedicated connection between the amplifier 20a and speakers 30a and/or 30b. In various implementations the dedicated connection made with the RCA cable 200 is persistent as long as the RCA cable 200 is coupled to the amplifier 20a (e.g., at an RCA connector on amplifier 20a) and the speaker(s) 30a and/or 30b. Once disconnected from the amplifier and/or speaker(s) 30a, 30b, the dedicated connection is terminated.

In the first mode, as illustrated in FIG. 2, the amplifier 20a is configured to provide the amplified audio (output) signal 60 to drive each speaker 30a, 30b. In certain cases, in the first mode, the controller 40 assigns a first equalization setting to the amplified audio signal 60 sent to each of the speakers 30*a*, 30*b*. In these examples, the same equalization setting is assigned to the amplified audio signal 60 sent to each speaker 30*a*, 30*b*.

In certain cases, in the first mode, the controller 40 is configured to switch the amplifier 20*a* into a low power mode in response to losing a connection with an audio input source 80. In certain cases, detecting the loss of connection with the audio input source 80 includes detecting a loss of Wi-Fi or Bluetooth connection, or detecting a loss of a paired connection with a television or visual entertainment device (e.g., via a signal detected from the TV or visual entertainment device). As described herein, the audio input source 80 can include one or more input devices. For example, the audio input source(s) 80 can be connected to the amplifier 20*a* via one or more hard-wired (e.g., RCA, or optical) connection(s) and/or wireless (e.g., Bluetooth, or Wi-Fi) connection(s). Additionally, in the first mode, while in low power mode, the controller 40 is configured to wake the amplifier 20 from the low power mode in response to detecting the connection with the audio input source(s) 80, e.g., a reconnection with one or more of the audio input source(s) 80.

In certain implementations, priority is assigned to input sources 80 based on the type of connection with the amplifier 20, such that if multiple input sources 80 are actively providing an input signal 50 at the same time, a particular audio source is selected over one or more additional audio sources (e.g., sources connected in terms of protocol priority such as: i) Wi-Fi, ii) Blueetooth, iii) optical or RCA). In some cases, input source priority is only relevant when input signals conflict and a user has not selected a particular source. In the case that the user selects an input source 80, e.g., optical input, the corresponding input signal 50 will be used for amplification and/or forwarding as described herein.

Figure 3:
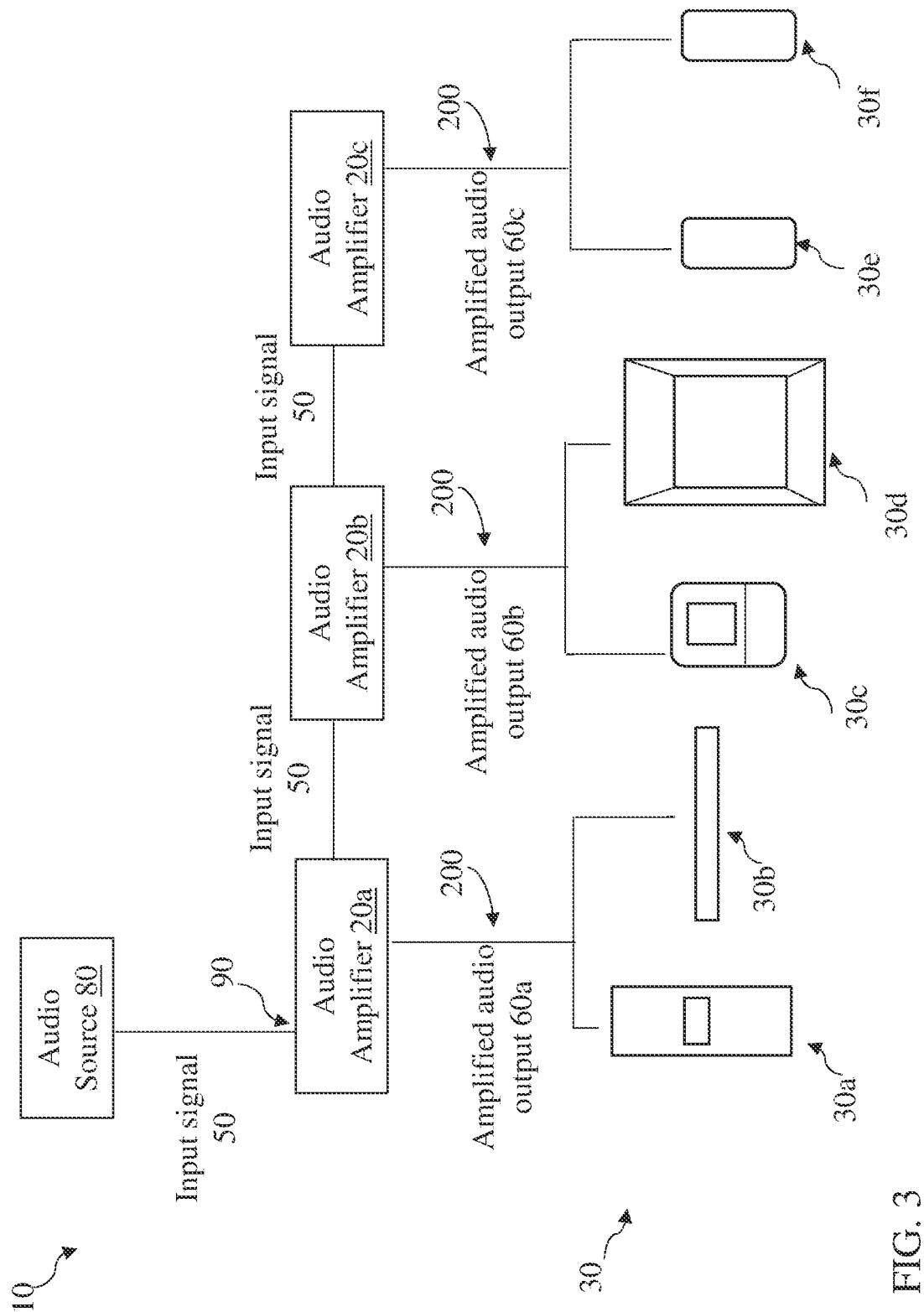
FIG. 3 is a schematic depiction of an audio amplifier coupled with speakers and additional audio amplifiers in a second operating mode, according to various implementations.

FIG. 3 illustrates an additional implementation where the controller 40 is configured to operate the amplifier (e.g., amplifier 20*a*) in a second mode. It is understood that the amplifiers 20 can be configured to operate in both the first and second modes, and can be configured to switch operating modes based on instructions via the controller 40, an interface on the amplifier(s) 20 and/or a connected device such as a controller and/or smart device, and/or detection of a device connection (such as connection with an additional amplifier 20 and/or speakers 30). In the second mode, illustrated in FIG. 3, the amplifier 20*a* has a direct physical connection with an additional audio amplifier 20*b*, 20*c*, etc. In the illustrated example in FIG. 3, amplifier 20*a* has a direct physical connection with additional amplifier 20*b*. It is understood that amplifier 20*b* can also have a direct physical connection with additional amplifier 20*c*, forming a "daisy chain" of amplifiers. Further downstream amplifiers 20*d*, 20*e*, etc. can also be connected with one of the amplifiers in the chain. As used herein, the direct physical connection can refer to any hard-wired connection between the amplifiers 20*a*, 20*b*, 20*c* that enables the first amplifier 20*a* (or any upstream amplifier) to forward the input signal 50 to enable the second amplifier 20*b* (or downstream amplifier(s)) to control audio output at one or more additional speakers 30*c*, 30*d*, etc. In particular cases, the direct physical connection is an RCA connection or an optical connection. That is, in the second mode, amplifiers 20 are configured to forward the input signal 50 to enable an additional amplifier 20 to control audio output at one or more additional speakers 30. In particular cases, each amplifier (e.g., amplifiers 20*a*, 20*b*, 20*c*) is capable of controlling (or, driving) audio output at up to two distinct speakers 30, and has a dedicated connection to each of the speakers 30 (e.g., RCA connection as described herein). In certain of these cases, a set of two or more amplifiers 20 can be strung together in a daisy chain to control audio output at a plurality of speakers 30.

In some cases, in the second mode, amplifier 20*a* acts as a master amplifier and the additional amplifier(s) 20*b*, 20*c*, 20*d* act as worker amplifiers. In certain examples, the first amplifier 20*a* is a master amplifier and is connected to one or more worker amplifiers 20*b*, 20*c*, 20*d*, etc. In some examples, assigning amplifiers 20 as a master amplifier or worker amplifier can be performed via an interface switch (e.g., described with respect to FIGS. 4 and 5), and remains persistent until modified, e.g., via the interface switch. In other examples, an amplifier is assigned as a master amplifier for one or more worker amplifiers automatically, such as assigning the master role in a random manner, based on being the first in a daisy chain of multiple amplifiers, based on the audio source being connected to that amplifier, or based on the amplifier being the most capable in the group of amplifiers. In certain cases where master/worker relationships are assigned, only the primary (or, master) amplifier (e.g., master amplifier 20*a*) is discoverable on a network control interface, for example, when controlling audio output. The master amplifier can facilitate one or more aspects of one or more connected worker amplifiers, such as controlling or providing at least one of audio playback content, audio playback timing, audio playback volume, audio playback equalization, power state, connection settings, or other aspects of worker amplifiers connected to the master amplifier as can be understood based on this disclosure.

In particular aspects, in the second mode, the amplifier 20 assigns distinct equalization settings to the amplified audio output signal 60 as compared with the forwarded input signal 50 that is sent to one or more of the additional amplifiers 20. For example, in FIG. 3, amplifier 20*a* can assign a first equalization setting to the amplified audio output signal 60 sent to speakers 30*a*, 30*b*, and assign a second equalization setting to the input signal 50 that is forwarded to amplifier 20*b* and output to speakers 30*c*, 30*d*. In another implementation, the controller 40 at each amplifier 20 assigns an equalization setting (EQ setting) to the amplified audio output signal (distinct output signals 60*a*, 60*b*, 60*c* indicated as examples in FIG. 3). Distinct equalization settings can be beneficial in a number of scenarios, e.g., where speakers 30*a*, 30*b* are in a different room than speakers 30*c*, 30*d*, and/or where speakers 30*a*, 30*b* are of a different type of speaker than speakers 30*c*, 30*d* (e.g., portable table-top speakers as compared with fixed installation speakers, or ceiling mounted speakers as compared with wall-mounted speakers, etc.).

Additionally, in various implementations, the controller 40 is configured to compensate for a delay between the input signal 50 and the amplified audio output signal 60. For example, the controller 40 can adjust the delay compensation between input signal 50 and amplified audio output signal 60 for a number of reasons, including, e.g., where speakers 30 connected to the same amplifier 20 or distinct amplifiers 20 are located in the same physical space such as a room. In certain of these cases, the controller adjusts the delay compensation between the input signal 50 and the amplified audio output signal 60 to synchronize or otherwise align the audio output from speakers 30 in the same room. In one example, two amplifiers 20*a*, 20*b* are configured to control audio output at four distinct speakers 30*a*, 30*b* and 30*c*, 30*d*, respectively. All of the speakers 30 are located in the same room, meaning that a listener is likely to audibly detect an unintended delay in output from speakers 30c, 30d as compared with speakers 30a, 30b. In these cases, the controller 40 at amplifier 20a can be configured to assign a delay to the amplified audio output signal 60 to speakers 30a, 30b in order to align the output from speakers 30c, 30d, controlled by amplifier 20b.

As described herein, equalization settings and signal delay can be controlled via an installation interface, and may be configured for a number of connected amplifiers 20.

In certain cases, in the second mode, the controller 40 is configured to control the power usage in the amplifier 20 according to one or more parameters. For example, in the second mode, the controller 40 is configured to switch the amplifier 20 into a low power mode after a period without receiving the audio input signal 50. Additionally, in the second mode, and while in the low power mode, the controller 40 is configured to wake the amplifier 20 from the low power mode in response to detecting the audio input signal 50. In certain implementations, one or more integrated circuits in the controller 40 or otherwise connected with the controller 40 in the amplifier 20 can include a low power micro that is configured to detect activity, e.g., the input signal 50, on the audio input line from the audio source 80 and/or a connected upstream amplifier 20.

Figure 4:
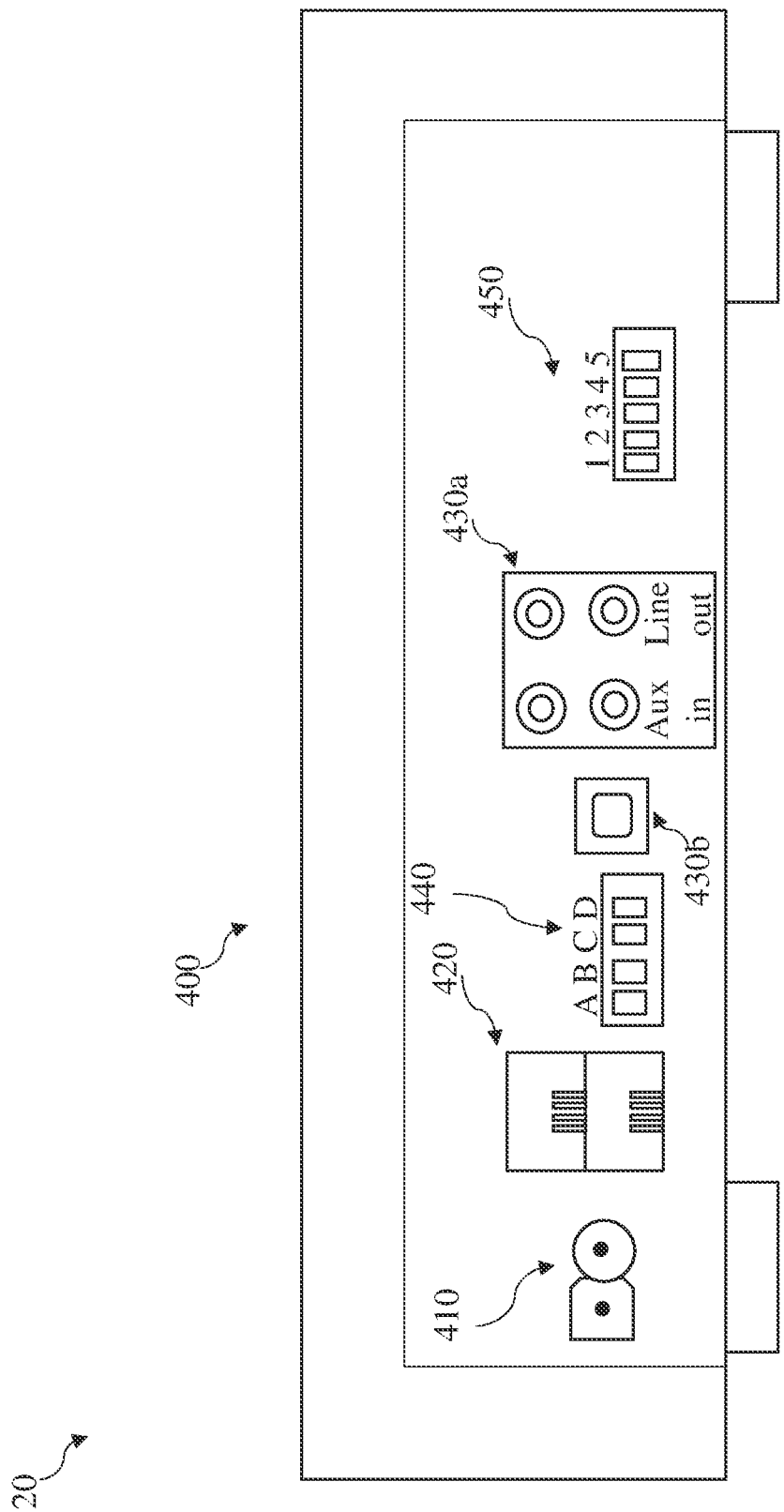
FIG. 4 is a side view of an example audio amplifier according to various implementations.

FIG. 4 illustrates an example side view of an amplifier 20, including a housing 400, according to certain implementations. As illustrated in this view of the housing 400, the amplifier 20 can include a power connection 410, one or more input connectors 420 (e.g., Ethernet connectors, USB connectors, etc.), audio line connectors 430 (e.g., input and output connectors such as RCA connectors 430a and/or optical connectors 430b), and at least one interface switch 440 coupled with the controller 40 (internal to housing 400) for enabling switching the amplifier 20 between the first mode and the second mode. In particular cases, the interface switch 440 enables switching of the amplifier 20 (e.g., via controller 40) between a master role and a worker role. In these cases, the interface switch 440 includes a multi-mode selector that allows the installer/operator to run a given amplifier 20 as an amplifier for speakers 30 (e.g., first mode), or as both an amplifier for speakers 30 and a conduit for downstream control of additional amplifier(s) 20 and connected speakers 30 (e.g., second mode).

Figure 5:
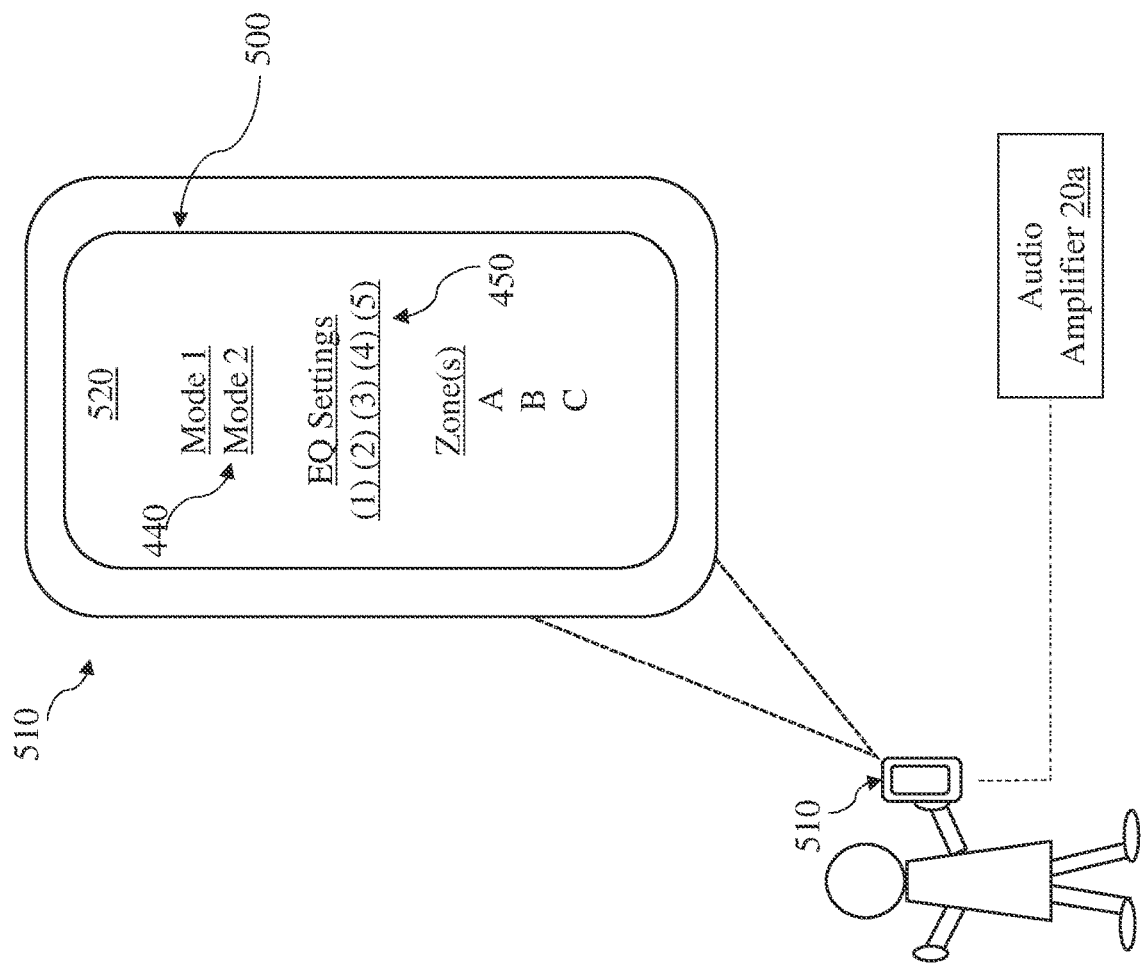
FIG. 5 is a schematic view of a control interface for an audio amplifier according to various implementations.

In some cases, the interface switch 440 includes a physical switch on the housing 400. However, in other implementations, the interface switch 440 is a digital switch that is enabled by a user interface either at the amplifier 20 or at an installation interface (e.g., on a connected controller and/or smart device). FIG. 5 illustrates a user interface 500 such as a graphical user interface (GUI) or other digital interface on a connected device 510, which can include a controller and/or a smart device with a wireless or hard-wired connection to the amplifier 20. Various interface control functions described herein can be performed via the interface 500, in addition to, or alternatively to the control functions enabled by physical interface components on the housing 400. In particular cases, the interface 500 includes an installation interface 520 for assigning speaker(s) 30 to audio amplifier(s) 20 in a grouping. In certain cases, the installation interface 520 enables the installer/operator to assign speakers 30 to one or more zones, e.g., spaces, rooms, sub-areas of rooms, etc. As noted herein, these speaker assignments (or, groupings) can remain persistent based on the hard-wired (e.g., RCA) connection with amplifiers 20.

In cases where the connected device 510 is a smart device, that smart device can be connected with the amplifier 20 via any wireless or hard-wired communications mechanism described herein, including but not limited to Internet-of-Things (IoT) devices and connections. In some cases, the smart device 510 can include hardware and/or software for executing functions of the controller 40 to manage audio amplification, signal forwarding and/or speaker connection functions in the amplifier 20. In particular cases, the smart device includes a smart phone, tablet computer, smart glasses, smart watch or other wearable smart device, portable computing device, etc. The smart device 510 can have an audio gateway, processing components, and one or more wireless transceivers for communicating with other devices in the system 10 (FIG. 1). For example, the wireless transceiver(s) can be used to communicate with the amplifier 20, as well as one or more connected smart devices within communications range. The wireless transceivers can also be used to communicate with a server hosting a mobile application that is running on the smart device 510, for example, an audio amplifier control engine.

Returning to the example illustrated in FIG. 4, the interface switch 440 is a physical switch on the housing 400, which enables an installer/operator to select between the operating modes for the amplifier 20, e.g., to enable the amplifier 20 to run independently of other amplifiers 20 or to couple the amplifier 20 with one or more additional amplifiers 20 in a daisy chain. In particular implementations, the controller 40 is configured to maintain the selection of the operating mode (e.g., first mode or second mode) until a command is received via the interface switch 440. FIG. 4 also shows an equalization selection control 450 that enables the installer/operator to assign equalization settings to the amplified audio output signal 60. In certain cases, the equalization selection control 450 includes a physical control panel or set of switches, however, as described herein, the equalization selection control 450 can be located on interface 500 at device 510 (FIG. 5). In various embodiments, the equalization selection control 450 permits selection between a plurality (e.g., two or three) of equalization settings. In certain examples, the equalization selection control 450 permits selection between at least five equalization settings. In particular cases, the equalization selection control 450 allows an installer/operator to assign equalization settings to the amplified audio output signal 60 based on a type of speaker 30 that is connected with the amplifier 20. For example, speaker type can be defined according to one or more of: intended use (e.g., indoor speaker, outdoor speaker, wall mounted speaker, ceiling mounted speaker, etc.), type of speaker enclosure (e.g., in a wall fixture, within a storage compartment), acoustic components (e.g., number of drivers and/or driver size), and/or intended placement in a room (e.g., upright, lying flat, on its side). In particular cases, the installer/operator can assign equalization settings to the amplified audio output signal 60 based on the type of speaker 30, and in certain cases, can assign several (e.g., five) or more equalization settings to the amplified audio output signal 60 based on those speaker types, e.g., assigning a same equalization setting to speakers 30 of a similar intended use, or to speakers 30 with similar acoustic components that are intended for placement in a room in the same orientation (e.g., upright). Of course, many other variations and combinations are possible.

In certain cases, in the second mode, the controller 40 is configured to switch the amplifier 20a into a low power mode after a period without receiving the audio input signal 50. In some examples, the period can be a matter of minutes, or in some cases, up to an hour or two. In a particular set of non-limiting examples, the period is equal to approximately several minutes, 5-10 minutes, 10-15 minutes, 15-20 minutes, or 20-30 minutes. Additionally, in the second mode, while in low power mode, the controller 40 is configured to wake the amplifier from the low power mode in response to detecting the audio input signal 50.

As noted herein, the audio amplifier 20 is configured to control audio amplification and manage connections with one or more speakers 30 and/or additional amplifiers 20. In various implementations, the audio amplifier 20 is configured to operate in distinct modes, enhancing the user experience and/or the installer experience in configuring and/or reconfiguring an audio system. Additionally, the nature of the modes and groupings of amplifiers and speakers allow the user and/or installer to define persistent, modular audio configurations.

The functionality described herein, or portions thereof, and its various modifications (hereinafter "the functions") can be implemented, at least in part, via a computer program product, e.g., a computer program tangibly embodied in an information carrier, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA and/or an ASIC (application-specific integrated circuit). Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

In various implementations, electronic components described as being "coupled" can be linked via conventional hard-wired and/or wireless means such that these electronic components can communicate data with one another. Additionally, sub-components within a given component can be considered to be linked via conventional pathways, which may not necessarily be illustrated.

Other embodiments not specifically described herein are also within the scope of the following claims. Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

We claim:

1. An audio amplifier for driving at least one speaker, the amplifier comprising:
    a controller for amplifying at least one input signal to provide an amplified audio output signal,
    wherein the controller is configured to operate the amplifier in at least two modes, comprising:
        a first mode comprising a dedicated connection to the at least one speaker; and
        a second mode comprising a direct physical connection with an additional audio amplifier and the dedicated connection to the at least one speaker,
        wherein in the first mode and the second mode the amplifier is configured to provide the amplified audio output signal to drive the at least one speaker, and wherein in the second mode the amplifier is configured to forward the at least one input signal to enable the additional audio amplifier to control audio output at an additional speaker.

2. The amplifier of claim 1, wherein the amplifier is incapable of outputting audio without the at least one speaker.

3. The amplifier of claim 1, wherein the at least one speaker consists of two distinct speakers.

4. The amplifier of claim 3, wherein the two distinct speakers comprise passive speakers, which when connected with the amplifier, are not configured to control equalization of the amplified audio output signal.

5. The amplifier of claim 4, wherein the audio output signal sent to each of the two distinct speakers has a single equalization setting.

6. The amplifier of claim 1, wherein in the second mode the amplifier acts as a master amplifier and the additional amplifier acts as a worker amplifier.

7. The amplifier of claim 1, further comprising an interface switch coupled with the controller that enables a change between the first mode and the second mode, wherein the controller maintains the selection of the first mode or the second mode until a command is received via the interface switch.

8. The amplifier of claim 7, wherein the interface switch comprises a physical switch located on a housing of the amplifier.

9. The amplifier of claim 1, wherein in the first mode the controller assigns a first equalization setting to the amplified audio output signal, and in the second mode the controller assigns a second, distinct equalization setting to the amplified audio output signal.

10. The amplifier of claim 1, further comprising a communications module for receiving the at least one audio input signal from an audio input source.

11. The amplifier of claim 1, wherein the controller is configured to compensate for a delay between the at least one input signal and the amplified audio output signal, wherein the delay compensation is adjustable.

12. The amplifier of claim 1, further comprising an installation interface for assigning the at least one speaker to the audio amplifier in a grouping.

13. The amplifier of claim 12, wherein the installation interface comprises an equalization selection control for assigning equalization settings to the amplified audio output signal based on a type of speaker connected with the amplifier.

14. The amplifier of claim 13, wherein the equalization selection control permits selection between at least five equalization settings.

15. The amplifier of claim 1, wherein in the second mode the controller is configured to:
    switch the amplifier into a low power mode after a period without receiving the audio input signal; and wake the amplifier from the low power mode in response to detecting the audio input signal.

16. The amplifier of claim 1, wherein in the first mode the controller is configured to:
switch the amplifier into a low power mode in response to losing a connection with an audio input source; and
wake the amplifier from the lower power mode in response to detecting the connection with the audio input source.

17. A method of driving at least one speaker with an amplifier, the method comprising:
receiving at least one input signal from an input source, amplifying the at least one input signal, and providing an amplified audio output signal to drive the at least one speaker,
wherein the amplifier is configured to operate in at least two modes, comprising:
a first mode comprising a dedicated connection to the at least one speaker; and
a second mode comprising a direct physical connection with an additional audio amplifier and the dedicated connection to the at least one speaker,
wherein in the first mode and the second mode the amplifier provides the amplified audio output signal to drive the at least one speaker, and wherein in the second mode the amplifier forwards the at least one input signal to enable the additional audio amplifier to control audio output at an additional speaker.

18. The method of claim 17, wherein in the second mode the amplifier acts as a master amplifier and the additional amplifier acts as a worker amplifier.

19. A system, comprising:
a set of at least two audio amplifiers for separately driving at least one speaker in a speaker set, each amplifier comprising a controller for amplifying at least one input signal to provide an amplified audio output signal,
wherein a primary amplifier is configured to operate in at least two modes, including: a first mode including a dedicated connection to the at least one speaker; and a second mode including a direct physical connection with a secondary amplifier and the dedicated connection to the at least one speaker,
wherein the controller in the primary amplifier is configured to:
in the first mode and the second mode, provide the amplified audio output signal to at least one of the speakers in the speaker set; and in the second mode, forward the at least one input signal to a second one of the amplifiers, and
wherein the controller in the secondary amplifier is configured to:
receive the forwarded at least one input signal; amplify the at least one input signal; and
provide the amplified input signal to at least one additional speaker in the set.

20. The system of claim 19, wherein the primary amplifier and the secondary amplifier are incapable of outputting audio without the at least one speaker.

* * * * *